United States Patent
Otsubo et al.

(10) Patent No.: US 11,335,645 B2
(45) Date of Patent: May 17, 2022

(54) HIGH-FREQUENCY MODULE AND MANUFACTURING METHOD THEREOF

(71) Applicant: Murata Manufacturing Co., Ltd., Kyoto (JP)

(72) Inventors: Yoshihito Otsubo, Kyoto (JP); Osamu Yamaguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/807,370

(22) Filed: Mar. 3, 2020

(65) Prior Publication Data
US 2020/0203288 A1 Jun. 25, 2020

Related U.S. Application Data

(63) Continuation of application No. PCT/JP2018/032529, filed on Sep. 3, 2018.

(30) Foreign Application Priority Data
Sep. 4, 2017 (JP) .............................. JP2017-169274

(51) Int. Cl.
H01L 23/552 (2006.01)
H01L 21/48 (2006.01)
(Continued)

(52) U.S. Cl.
CPC ........ H01L 23/552 (2013.01); H01L 21/4853 (2013.01); H01L 21/561 (2013.01); H01L 23/49811 (2013.01); H01L 25/00 (2013.01)

(58) Field of Classification Search
CPC . H01L 23/552; H01L 23/49881; H01L 25/00; H01L 21/4853; H01L 21/561
See application file for complete search history.

(56) References Cited

U.S. PATENT DOCUMENTS

2006/0267159 A1* 11/2006 Yamamoto .......... H01L 23/3121
257/659
2013/0223038 A1 8/2013 Yamamoto et al.
(Continued)

FOREIGN PATENT DOCUMENTS

JP 2006-196857 * 7/2006
JP 2006-196857 A 7/2006
(Continued)

OTHER PUBLICATIONS

International Search Report for International Application No. PCT/JP2018/032529, dated Oct. 23, 2018.
(Continued)

Primary Examiner — Timor Karimy
(74) Attorney, Agent, or Firm — Pearne & Gordon LLP

(57) ABSTRACT

A high-frequency module 1 includes: a substrate 2; a first component 4 mounted on an upper surface 2a of the substrate 2; a second component 5 mounted on a lower surface 2b of the substrate 2; an upper sealing resin layer 6 and a lower sealing resin layer 7; a conductor pin 8; and a shield layer 9. The conductor pin 8 includes a terminal portion 8a exposed from a lower surface 7a of the lower sealing resin layer 7 and connected to a ground electrode of an outer substrate, and a shield connection portion 8b exposed from a side surface 7b of the lower sealing resin layer 7 and connected to the shield layer 9. As a result of the terminal portion 8a of the conductor pin 8 being connected to the ground electrode, the shield layer 9 is connected to a ground potential with the shortest distance therebetween.

7 Claims, 9 Drawing Sheets

(51) Int. Cl.
*H01L 21/56* (2006.01)
*H01L 23/498* (2006.01)
*H01L 25/00* (2006.01)

(56) References Cited

U.S. PATENT DOCUMENTS

| | | |
|---|---|---|
| 2014/0182918 A1 | 7/2014 | Ogawa et al. |
| 2017/0062360 A1* | 3/2017 | Chang .................... H01L 21/78 |
| 2017/0323838 A1 | 11/2017 | Otsubo et al. |
| 2018/0166394 A1 | 6/2018 | Otsubo et al. |

FOREIGN PATENT DOCUMENTS

| | | |
|---|---|---|
| JP | 2009-218258 A | 9/2009 |
| JP | 2012-028486 A | 2/2012 |
| JP | 2012-253190 A | 12/2012 |
| JP | 5768888 B2 | 8/2015 |
| WO | 2012/056879 A1 | 5/2012 |
| WO | 2016/121491 A1 | 8/2016 |
| WO | 2017/026430 A1 | 2/2017 |

OTHER PUBLICATIONS

Written Opinion for International Application No. PCT/JP2018/032529, dated Oct. 23, 2018.

\* cited by examiner

HIGH-FREQUENCY MODULE AND MANUFACTURING METHOD THEREOF

This is a continuation of International Application No. PCT/JP2018/032529 filed on Sep. 3, 2018 which claims priority from Japanese Patent Application No. 2017-169274 filed on Sep. 4, 2017. The contents of these applications are incorporated herein by reference in their entireties.

BACKGROUND OF THE DISCLOSURE

Field of the Disclosure

The present disclosure relates to a high-frequency module including a shield layer, and a manufacturing method thereof.

Description of the Related Art

Some high-frequency modules loaded in portable terminal devices and the like are provided with a shield layer for shielding from electromagnetic waves. In some modules of such a type, a component mounted on a substrate is covered with a mold resin, and a shield layer is provided so as to cover the surface of the mold resin. As a high-frequency module provided with such a shield layer, for example, Patent Document 1 discloses a module 100, illustrated in FIG. 10.

In the module 100, a component 102 mounted on an upper surface 101a of a substrate 101 is covered with an upper sealing resin layer 103, a plurality of components 102 mounted on a lower surface 101b of the substrate 101 and a plurality of metal pins 105 serving as connection terminals are covered with a lower resin layer 104, and a shield layer 106 is formed on the surface of the upper sealing resin layer 103. Due to the provision of the shield layer 106, noise from outside with respect to the components 102 can be prevented, and radiation of electromagnetic waves from the components 102 can be prevented. Moreover, the shielding effect can be further improved by electrically connecting the shield layer 106 to a ground wiring provided at the substrate 101.

Patent Document 1: Japanese Patent No. 5768888 (refer to paragraphs 0078 to 0080 and FIG. 6)

BRIEF SUMMARY OF THE DISCLOSURE

However, when, as with the aforementioned module 100, the shield layer 106 is connected to the ground wiring provided at the substrate 101, shield resistance may increase because a distance from the shield layer 106 to the ground increases. In addition, there is a problem of design flexibility of the substrate 101 decreasing as a result of the ground wiring being provided at the substrate 101.

The present disclosure is made in consideration of the aforementioned problems, and an object of the present disclosure is to provide a high-frequency module that reduces shield resistance by connecting a shield layer to a ground electrode with the shortest distance therebetween and that does not require, for a substrate, wiring for ground connection and can improve design flexibility of the substrate.

To achieve the aforementioned object, a module according to the present disclosure includes: a substrate; a first component mounted on a first major surface of the substrate; a first sealing resin layer that seals the first major surface and the first component; a second sealing resin layer laminated on a second major surface of the substrate and having an abutting surface abutting on the second major surface of the substrate, a opposite surface opposing the abutting surface, and a side surface connecting edges of the abutting surface and the opposite surface to each other; a connection conductor disposed at the second sealing resin layer; and a shield layer that covers at least a surface of the first sealing resin layer, the side surface of the second sealing resin layer, and a side surface of the substrate connecting edges of the first major surface and the second major surface to each other, in which the connection conductor includes a portion exposed from the side surface of the second sealing resin layer and connected to the shield layer, and a portion exposed from the opposite surface of the second sealing resin layer and connected to a ground electrode of an outer substrate.

According to this configuration, the shield layer can be connected to a ground potential with a short distance therebetween, compared with when being connected to a ground electrode disposed at the substrate, and it is thus possible to reduce shield resistance and improve shielding performance. Moreover, the shield layer and the ground potential can be connected to each other in a large area because the connection conductor connected to the ground electrode and the shield layer are connected to each other, and it is thus possible to address stabilization of shielding performance.

The connection conductor may include a pair of leg portions erected at the second major surface with first ends of the pair of leg portions connected to the second major surface of the substrate, and a bridging portion connecting second ends of the pair of leg portions to each other. In the connection conductor, the bridging portion may include a portion exposed from the side surface of the second sealing resin layer, and a portion exposed from the opposite surface. Each of the leg portions may include a portion exposed from the side surface of the second sealing resin layer. According to this configuration, at the side surface of the second sealing resin layer, the connection area between the connection conductor and the shield layer can be increased, and it is thus possible to address further stabilization of the shielding performance.

The connection conductor may include: a first portion extending in a direction parallel to the second major surface of the substrate with a first end of the first portion exposed from the side surface of the second sealing resin layer; and a second portion extending from a second end of the first portion toward the opposite surface of the second sealing resin layer and having an end portion exposed from the opposite surface. According to this configuration, at the opposite surface of the second sealing resin layer, the connection portion of the connection conductor connected to the ground electrode of the outer substrate is not in contact with the shield layer, and it is thus possible to suppress the shield layer from being damaged during the reflow treatment of the substrate. It is also possible to suppress, when the connection to the outer substrate is performed, a short circuit from occurring between a solder and an electronic component adjacent thereto with the shield layer interposed therebetween.

The connection conductor may include a third portion extending in a direction parallel to the opposite surface of the second sealing resin layer, and a fourth portion extending from a first end of the third portion toward the second major surface of the substrate. The third portion may include a portion exposed from the side surface of the second sealing resin layer, and a portion exposed from the opposite surface of the second sealing resin layer. According to this configuration, the shield layer can be connected to the ground potential with a short distance therebetween, compared with when being connected to a ground electrode disposed at the substrate, and it is thus possible to reduce shield resistance and improve shielding performance.

The connection conductor may not be connected to the substrate. According to this configuration, a land electrode for connecting the connection conductor to the substrate is not required, and it is thus possible to reduce the wiring area of the substrate and improve design flexibility of the substrate.

A second component mounted on the second major surface of the substrate may be further included, and the connection conductor may be in contact with the second component. According to this configuration, due to the connection conductor being in contact with the second component, it is possible to cause the heat generated from the second component to move outside the module.

A method of manufacturing the high-frequency module according to the present disclosure includes: a substrate aggregate preparation step of preparing a substrate aggregate including a plurality of the substrates arrayed in a matrix form; a mounting step of mounting the first component on the first major surface of each of the plurality of substrates and, on a side of the second major surface of each of the plurality of substrates, mounting a conductor pin joined body so as to span the substrates adjacent to each other, the conductor pin joined body including two conductor pins each including the third portion, respective third portions of the two conductor pins being connected to each other at second ends thereof; a sealing-resin-layer formation step of forming the first sealing resin layer that seals the first component mounted on each of the plurality of substrates and the first major surface of each of the plurality of substrates, and forming the second sealing resin layer that seals the conductor pin joined body mounted on each of the plurality of substrates and the second major surface of each of the plurality of substrates; an exposing step of grinding or abrading the opposite surface of the second sealing resin layer, thereby exposing a portion of the conductor pin joined body from the opposite surface of the second sealing resin layer; and a dividing step of dividing the substrate aggregate into the substrates divided from each other, in which, in the mounting step, one of the fourth portions in the conductor pin joined body is connected to one of the substrates adjacent to each other, another of the fourth portions is connected to another of the substrates adjacent to each other, and the conductor pin joined body is thereby mounted so as to span the substrates adjacent to each other, and in which, in the dividing step, the first sealing resin layer, the second sealing resin layer, and the substrate aggregate are cut together with, of the conductor pin joined body, a connection portion between the two conductor pins to form connection conductors, and a portion of the third portion in each of the connection conductors is exposed from the side surface of the second sealing resin layer.

In this case, the shield layer can be connected to the ground potential with a short distance therebetween, compared with when being connected to a ground electrode disposed at the substrate, and it is thus possible to manufacture a module having low shield resistance. In addition, the connection area between the shield layer and the connection conductor can be increased, and it is thus possible to address stabilization of shielding performance.

According to the present disclosure, a shield layer can be connected to a ground potential with the short distance therebetween, compared with when being connected to a ground electrode disposed at a substrate, and it is thus possible to reduce shield resistance. Moreover, the substrate requires no wiring for ground connection, and it is thus possible to improve design flexibility of the substrate.

DETAILED DESCRIPTION OF THE DISCLOSURE

First Embodiment

Figure 1:
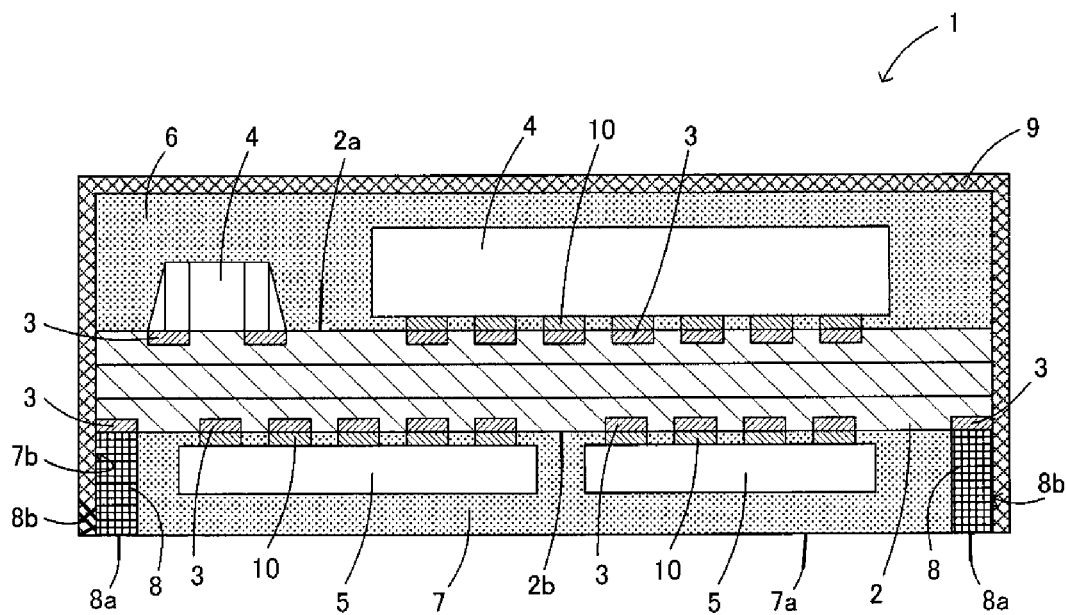
FIG. 1 is a sectional view of a high-frequency module according to a first embodiment of the present disclosure.
Figure 2:
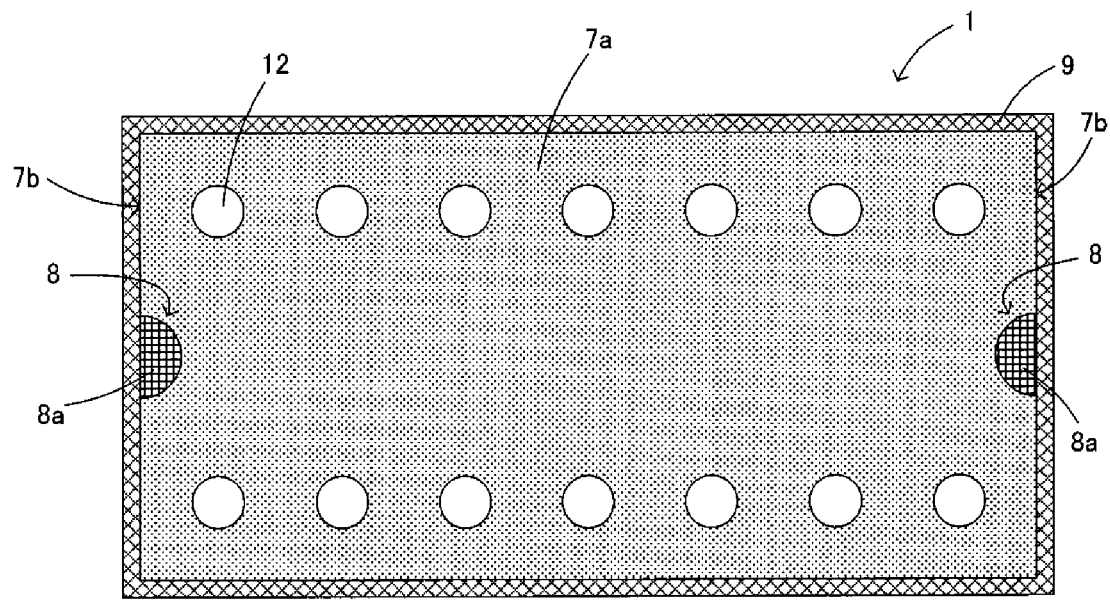
FIG. 2 is a rear view of the high-frequency module according to the first embodiment of the present disclosure.

A high-frequency module 1 according to a first embodiment of the present disclosure will be described with reference to FIG. 1 and FIG. 2. FIG. 1 is a sectional view of the high-frequency module 1 according to the first embodiment, and FIG. 2 is a rear view of the high-frequency module in FIG. 1.

The high-frequency module 1 according to the first embodiment is configured to be loaded on, for example, a mother substrate or the like of an electronic device. As illustrated in FIG. 1, the high-frequency module 1 includes: a substrate 2 having an upper surface 2a (corresponding to the "first major surface" of the present disclosure) and a lower surface 2b (corresponding to the "second major surface" of the present disclosure) on which land electrodes 3 are formed; a plurality of first components 4 mounted on the upper surface 2a of the substrate 2; a plurality of second components 5 mounted on the lower surface 2b of the substrate 2; an upper sealing resin layer 6 (corresponding to the "first sealing resin layer" of the present disclosure) that seals the upper surface 2a of the substrate 2 and the first components 4; a lower sealing resin layer 7 (corresponding to the "second sealing resin layer" of the present disclosure) that seals the lower surface 2b of the substrate 2 and the second components 5; a plurality of conductor pins 8 (corresponding to the "connection conductor" of the present disclosure) disposed at the lower sealing resin layer 7; and a shield layer 9 that covers a surface of the upper sealing resin layer 6, a side surface of the substrate 2, and a side surface 7b of the lower sealing resin layer 7.

The substrate 2 is formed of, for example, a low-temperature co-firing ceramic, a glass epoxy resin, or the like. A plurality of the land electrodes 3 are formed on the upper surface 2a and the lower surface 2b of the substrate 2, and a plurality of ground electrodes (not illustrated), a plurality of wiring electrodes (not illustrated), a plurality of via conductors (not illustrated), and the like are formed at the surface layer and the inner layer of the substrate 2. The ground electrodes are formed, for example, so as to be exposed from the side surface of the substrate 2.

The land electrodes 3, the ground electrodes, and the wiring electrodes are each formed of a metal, such as Cu, Ag, Al, or the like, that is commonly employed as an electrode. The via conductors are formed of a metal, such as Ag, Cu, or the like.

Examples of the first components 4 and the second components 5 are components, such as an inductor, a capacitor, an IC, a power amplifier, and the like. The first components 4 are mounted on the upper surface 2a of the substrate 2 due to the connection terminals connected with solders 10 to the land electrodes 3 formed on the upper surface 2a of the substrate 2. The second components 5 are mounted on the lower surface 2b of the substrate 2 due to the connection terminals connected with solders 10 to the land electrodes 3 formed on the lower surface 2b of the substrate 2. The number of each of the first components 4 and the second components 5 mounted on the substrate 2 may be one.

The upper sealing resin layer 6 is disposed on the substrate 2 so as to cover the upper surface 2a of the substrate 2 and the first components 4, and the lower sealing resin layer 7 is disposed so as to cover the lower surface 2b of the substrate 2 and the second components 5. The upper sealing resin layer 6 and the lower sealing resin layer 7 can be formed of a resin, such as a silica filler-containing epoxy resin or the like, commonly employed as a sealing resin. For the purpose of improving the heat dissipation, a filler, such as an alumina filler, having high thermal conductivity may be used. As illustrated in FIG. 2, connection terminals 12 for the connection to an outer substrate may be disposed on a lower surface 7a of the lower sealing resin layer 7.

The conductor pins 8 as connection conductors are formed of a material, such as Cu, a Cu alloy including a Cu—Ni alloy and a Cu—Fe alloy, Fe, Au, Ag, Al, or the like. The conductor pins 8 are formed of, for example, a metal conductor wire material that has a desired diameter, has a circular or polygonal sectional shape, and is sheared to a predetermined length. The conductor pins 8 each include an end exposed from the lower surface 7a of the lower sealing resin layer 7 and serve as terminal portions 8a for the connection to a ground electrode disposed at the outer substrate. Shield connection portions 8b obtained as a result of the conductor pins 8 being exposed from the side surface 7b of the lower sealing resin layer 7 are connected to the shield layer 9. Consequently, when the high-frequency module 1 is mounted on the outer substrate, the ground electrode disposed at the outer substrate and the conductor pins 8 are connected to each other, and as a result, the shield layer 9 and the ground electrode disposed at the outer substrate are electrically connected to each other.

The shield layer 9 is for shielding the wiring electrodes in the substrate 2, the ground electrodes, and the first components 4 from electromagnetic waves from outside and is formed so as to cover the surface of the upper sealing resin layer 6, the side surface of the substrate 2, and the side surface 7b of the lower sealing resin layer 7. The shield layer 9 is electrically connected to, for example, the ground electrode disposed at the outer substrate with the conductor pins 8 interposed therebetween. In other words, the shield layer 9 is directly connected to the ground electrode disposed at the outer substrate without the wiring in the substrate 2 interposed therebetween. The shield layer 9 may be formed at the inner layer of the substrate 2 and may be electrically connected to the ground electrodes exposed at the side surface of the substrate 2.

The shield layer 9 can be formed by a multilayer structure having a close-contact film laminated on surfaces of the sealing resin layers 6 and 7, a conductive film laminated on the close-contact film, and a protective film laminated on the conductive film. The close-contact film is disposed for increasing a close-contact strength between the conductive film and the sealing resin layers 6 and 7 and can be formed of, for example, a metal, such as SUS. The close-contact film may be Ti, Cr, Ni, TiAl, or the like. The conductive film is a layer that bears a substantial shielding function of the shield layer 9 and can be formed of, for example, a metal of Cu, Ag, or Al. The protective film is disposed for preventing the conductive film from corroding and being damaged and can be formed of, for example, SUS. The protective film may be Ti, Cr, Ni, TiAl, or the like.

(Method of Manufacturing High-frequency Module)

Next, a method of manufacturing the high-frequency module 1 will be described. In the first embodiment, an aggregate of a plurality of the high-frequency modules 1 is formed and thereafter divided to thereby manufacture the high-frequency modules 1.

First, an aggregate of the substrates 2 each including a plurality of the land electrodes 3 formed on the upper surface 2a and the lower surface 2b thereof and a plurality of the ground electrodes, a plurality of the wiring electrodes, a plurality of the via conductors, and the like that are formed at the surface layer or the inner layer thereof is prepared. The land electrodes 3, the ground electrodes, and the wiring electrodes can be formed by, for example, performing screen printing with a conductive paste that contains a metal, such as Cu, Ag, Al, or the like. The via conductors can be formed by a known method after forming via holes with laser or the like.

Next, the components 4 and 5 are mounted on the upper surface 2a and the lower surface 2b of the substrate 2 by using a known surface mount technology. For example, the solders 10 are formed on, of the land electrodes 3 on the substrate 2, desired land electrodes 3, the components 4 and 5 are mounted on, of the land electrodes 3 on which the solders 10 are formed, the corresponding land electrodes 3, and thereafter, reflow treatment is performed. After the reflow treatment, cleaning of the aggregate of the substrates 2 may be performed, as necessary.

Next, the conductor pins 8 are mounted on the lower surface 2b of the substrate 2 by using a known surface mount technology. The conductor pins 8 are formed by mounting columnar metal pins on the boundaries between the substrates 2 adjacent to each other so as to be connected to both the adjacent substrates 2 that are before being divided, and cutting the metal pins together with the substrates when dividing is performed. As illustrated in FIG. 2, as a result of being thus formed, the conductor pins 8 each have a cross section (the terminal portion 8a) that is semicircular at the rear surface (the lower surface 7a of the lower sealing resin layer 7) of the high-frequency module 1. In other words, the conductor pins 8 each have a form of a semicircular columnar pin erected at the lower sealing resin layer 7, and the flat side surfaces of the conductor pins 8 are connected to the shield layer 9. The conductor pins 8 may not have the semicircular cross section provided that the conductor pins 8 are columnar pins.

Thereafter, the upper sealing resin layer 6 and the lower sealing resin layer 7 are formed so as to cover the components 4 and 5 mounted on the upper surface 2a and the lower surface 2b of the substrate 2. For the sealing resin layers 6 and 7, for example, a transfer mold method, a compression mold method, a liquid resin method, a sheet resin method, or the like is usable. In the sealing resin layers 6 and 7, an epoxy resin containing a common silica filler is usable. For causing the sealing resin layers 6 and 7 to have high thermal conductivity, an epoxy resin containing a high thermal conductivity filler, such as alumina filler, is usable. After the sealing resin layers 6 and 7 are formed, plasma cleaning of the substrate 2 may be performed, as necessary.

After the lower sealing resin layer 7 is formed, the lower surface 7a of the lower sealing resin layer 7 is ground or abraded so that the terminal portions 8a of the conductor pins 8 are exposed.

After the sealing resin layers 6 and 7 are formed, with a dicer or by a known method, such as laser machining, the high-frequency modules 1 are divided from each other. Thereafter, with a sputtering apparatus or a vacuum deposition apparatus, the shield layer 9 is formed so as to cover the surface of the upper sealing resin layer 6, the side surface 7b of the lower sealing resin layer 7, and the side surface of the substrate 2, thereby completing the high-frequency modules 1.

According to the aforementioned embodiment, when the high-frequency module 1 is mounted on the outer substrate, as a result of the ground electrode disposed at the outer substrate and the conductor pins 8 being connected to each other, the shield layer 9 is connected to a ground potential. In other words, the shield layer 9 is directly connected to the ground electrode disposed at the outer substrate with the conductor pins 8 interposed therebetween, without the wiring in the substrate 2 interposed therebetween. Therefore, compared with the connection to the ground potential through the ground electrodes disposed at the inner layer of the substrate 2, the connection to the ground potential can be performed with a short distance therebetween, which enables a reduction in shield resistance. Moreover, the substrate requires no wiring for ground connection, which enables an improvement in design flexibility of the substrate. In addition, it is possible to make the connection area between the shield layer 9 and the conductor pins 8 larger than that with the connection to the ground electrodes disposed at the substrate 2, that is, the connection area between the shield layer 9 and the ground electrode can be increased, which can stabilize shielding performance.

(Modification of Conductor Pin)

Figure 3:
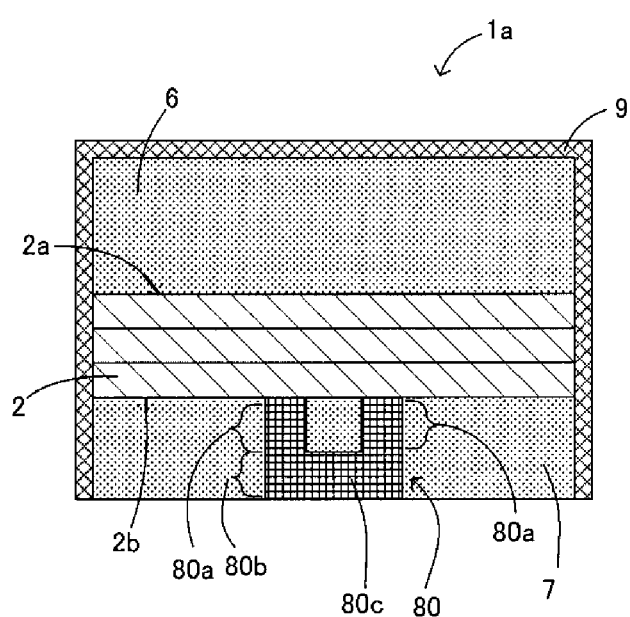
FIG. 3 illustrates a modification of the high-frequency module in FIG. 1.

A modification of the conductor pins 8 will be described with reference to FIG. 3. FIG. 3 is a side view of a high-frequency module 1a.

As illustrated in FIG. 3, a conductor pin 80 is formed by a U-shaped pin having a pair of leg portions 80a connected at respective one ends to the lower surface 2b of the substrate 2, and a bridging portion 80b connecting the other ends of the leg portions 80a to each other. At the side surface 7b of the lower sealing resin layer 7, a shield connection portion 80c constituted by a side surface of each of the leg portions 80a and a side surface of the bridging portion 80b has a U-shape. In this case, the connection area between the shield layer 9 and the conductor pin 80 can be further increased.

Second Embodiment

A high-frequency module 1b according to a second embodiment of the present disclosure will be described with reference to FIGS. 4A, 4B, and FIGS. 5A and 5B. Each of FIGS. 4A and 4B is a sectional view of the high-frequency module 1b according to the second embodiment, and each of FIGS. 5A and 5B is a sectional view illustrating a method of manufacturing the high-frequency module 1b in each of FIGS. 4A and 4B.

Figure 4A:
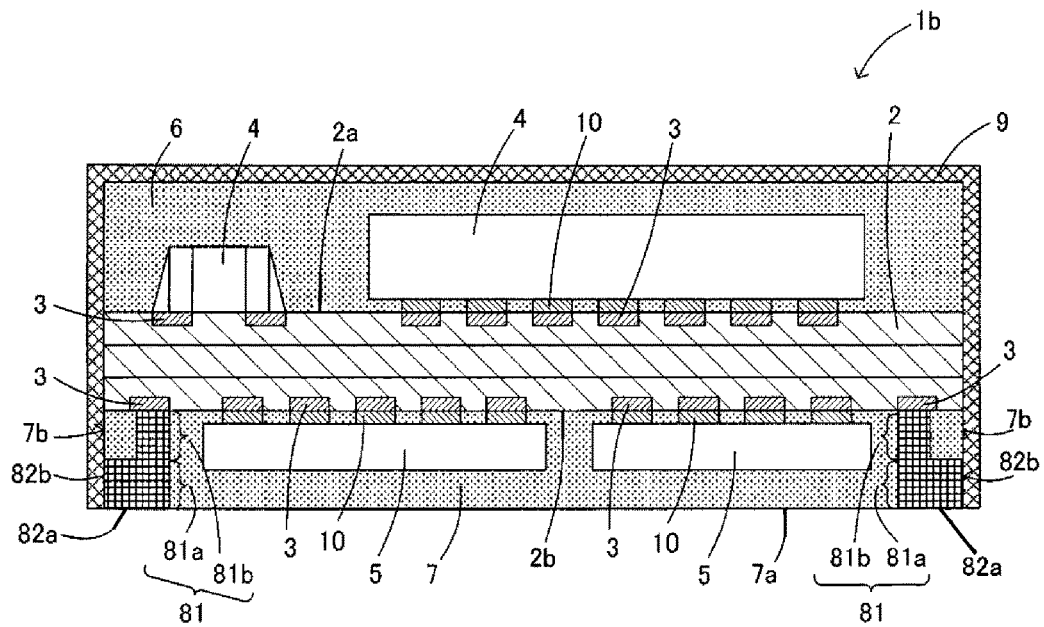
FIGS. 4A and 4B Each of FIGS. 4A and 4B is a sectional view of a high-frequency module according to a second embodiment of the present disclosure.
Figure 4B:
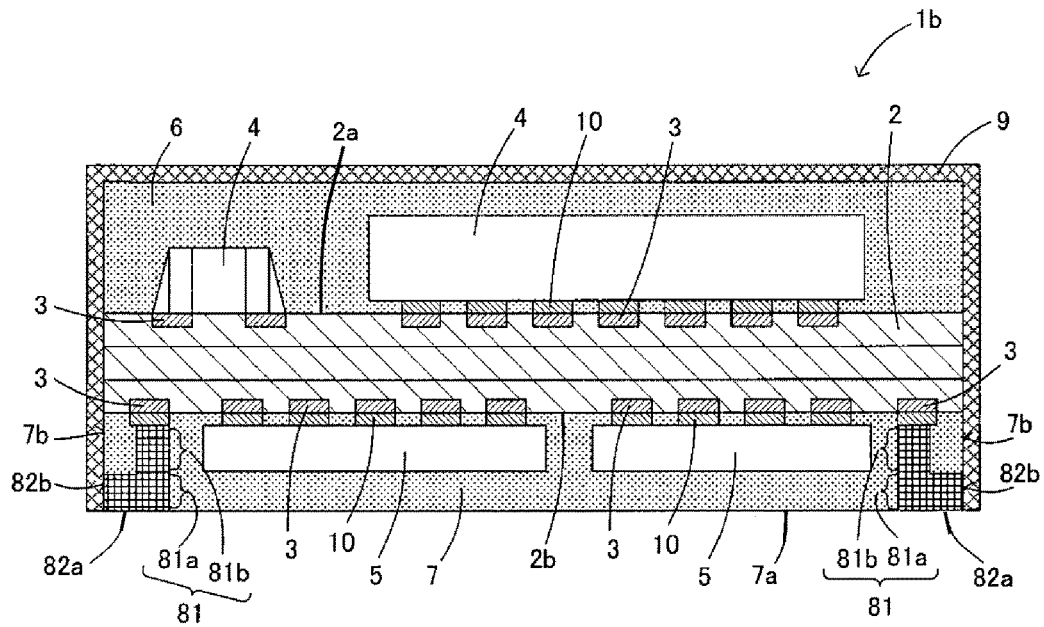
Figure 5A:
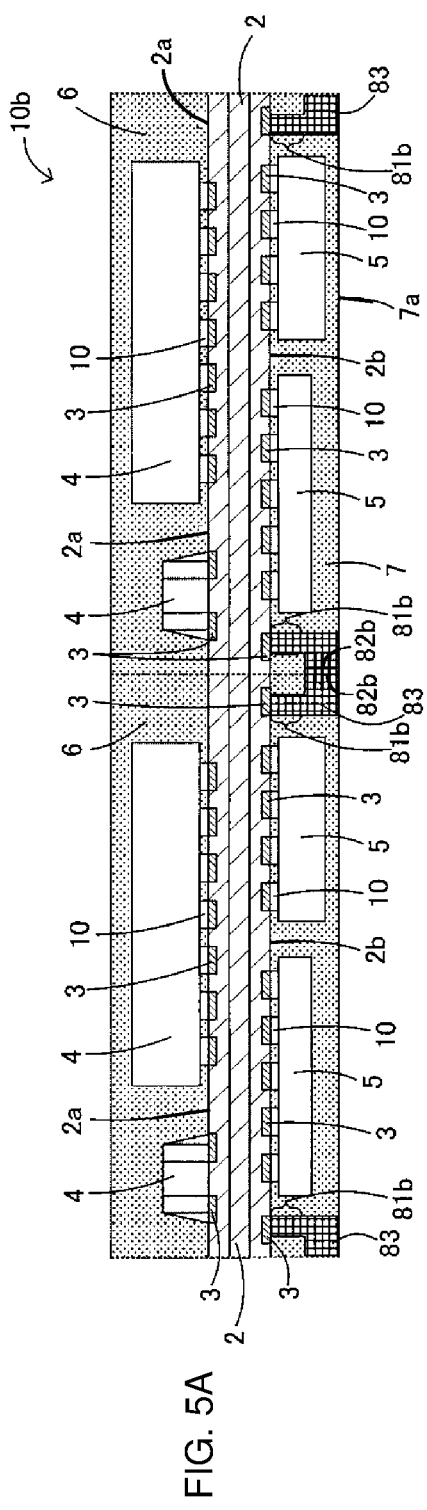
FIGS. 5A and 5B Each of FIGS. 5A and 5B illustrates a method of manufacturing the high-frequency module in each of FIGS. 4A and 4B.
Figure 5B:
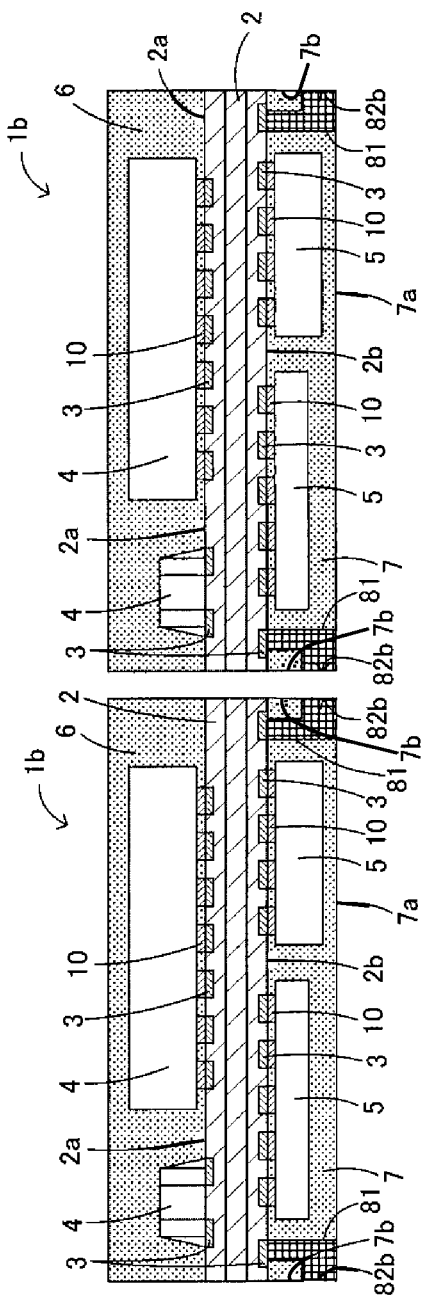

The high-frequency module 1b according to the second embodiment differs from the high-frequency module 1 according to the first embodiment described with FIG. 1 and FIG. 2 in terms of that, as illustrated in FIGS. 4A and 4B, conductor pins 81 are formed by L-shaped pins. The other configurations are identical to those of the high-frequency module 1 according to the first embodiment, and description thereof is thus omitted by giving identical signs thereto.

As illustrated in FIG. 4A, the conductor pins 81 are each formed by an L-shaped pin having a horizontal portion 81a (corresponding to the "third portion" in the present disclosure) exposed from the lower surface 7a of the lower sealing resin layer 7, and a vertical portion 81b (corresponding to the "fourth portion" in the present disclosure) extending from the horizontal portion 81a in the direction of the lower surface 2b of the substrate 2. The horizontal portion 81a has a terminal portion 82a, which is a terminal exposed from the lower surface 7a of the lower sealing resin layer 7 and connected to the ground electrode disposed at the outer substrate, and a shield connection portion 82b exposed from the side surface 7b of the lower sealing resin layer 7. When the high-frequency module 1b is mounted on the outer substrate, the terminal portion 82a is connected to the ground electrode disposed at the outer substrate. The shield connection portion 82b is connected to the shield layer 9. As a result, the shield layer 9 and the ground electrode disposed at the outer substrate are electrically connected to each other. The conductor pins 81 may be connected to the ground electrodes disposed at the substrate 2.

When there is a possibility of gaps being generated between the lower surface 2b of the substrate 2 and the conductor pins 81, as illustrated in FIG. 4B, if the conductor pins 81 are directly disposed with respect to the substrate 2, the generation of gaps can be suppressed by forming the solders 10 between the lower surface 2b of the substrate 2 and the conductor pins 81.

(Method of Manufacturing High-frequency Module)

With reference to FIGS. 5A and 5B, a method of manufacturing the high-frequency module 1b will be described. In the second embodiment, an aggregate 10b of a plurality of the high-frequency modules 1b is formed and thereafter divided, thereby manufacturing the high-frequency modules 1b. FIG. 5A is a sectional view of the aggregate 10b of the high-frequency modules 1b that are before being divided, and FIG. 5B is a sectional view of the high-frequency modules 1b that have been divided.

First, the aggregate 10b of the substrates 2 each including a plurality of the land electrodes 3 formed on the upper surface 2a and the lower surface 2b thereof and a plurality of the ground electrodes, a plurality of the wiring electrodes, a plurality of the via conductors, and the like that are formed at the surface layer or the inner layer thereof is prepared. The land electrodes 3, the ground electrodes, and the wiring electrodes can be formed by, for example, performing screen printing with a conductive paste that contains a metal, such as Cu, Ag, Al, or the like. The via conductors can be formed by a known method after forming via holes by using laser or the like.

Next, the components 4 and 5 are mounted on the upper surface 2a and the lower surface 2b of the substrate 2 by using a known surface mount technology. For example, the solders 10 are formed on, of the land electrodes 3 on the substrate 2, the desired land electrodes 3, the components 4 and 5 are mounted on, of the land electrodes 3 on which the solders 10 are formed, the corresponding land electrodes 3, and thereafter, reflow treatment is performed. After the reflow treatment, cleaning of the aggregate 10b of the substrates 2 may be performed, as necessary.

Next, as illustrated in FIG. 5A, U-shaped conductor pin joined bodies 83 each constituted by the shield connection portions 82b joined to each other are mounted on the lower surface 2b of the substrate 2. At this time, each conductor pin joined body 83 is mounted such that the conductor pin joined body 83 spans a boundary (the dotted-line portion in FIG. 5A) between the substrates 2 adjacent to each other with one of the vertical portions 81b of the conductor pin joined body 83 being connected to one of the adjacent substrates 2 and the other vertical portion 81b being connected to the other substrate 2.

Thereafter, by cutting with a dicing machine or by laser machining or the like, the high-frequency modules 1b are divided from each other. During dividing, each of the conductor pin joined bodies 83 is divided into two, and the shield connection portions 82b are exposed (refer to FIG. 5B) from the side surface 7b of the lower sealing resin layer 7. The shield layer 9 is formed on the divided high-frequency modules 1b by a method, such as sputtering, spin coating, or the like, and the high-frequency modules 1b are thereby completed.

According to the aforementioned embodiment, the shield layer 9 can be connected to the ground potential with a short distance therebetween, compared with when being connected to the ground electrodes disposed at the substrate 2, which can reduce shield resistance and improve shielding performance.

Third Embodiment

A high-frequency module 1c according to a third embodiment of the present disclosure will be described with reference to FIGS. 6A, 6B and FIG. 7. Each of FIGS. 6A and 6B is a sectional view of the high-frequency module 1c according to the third embodiment, and FIG. 7 is a rear view of the high-frequency module 1c in each of FIGS. 6A and 6B.

Figure 6A:
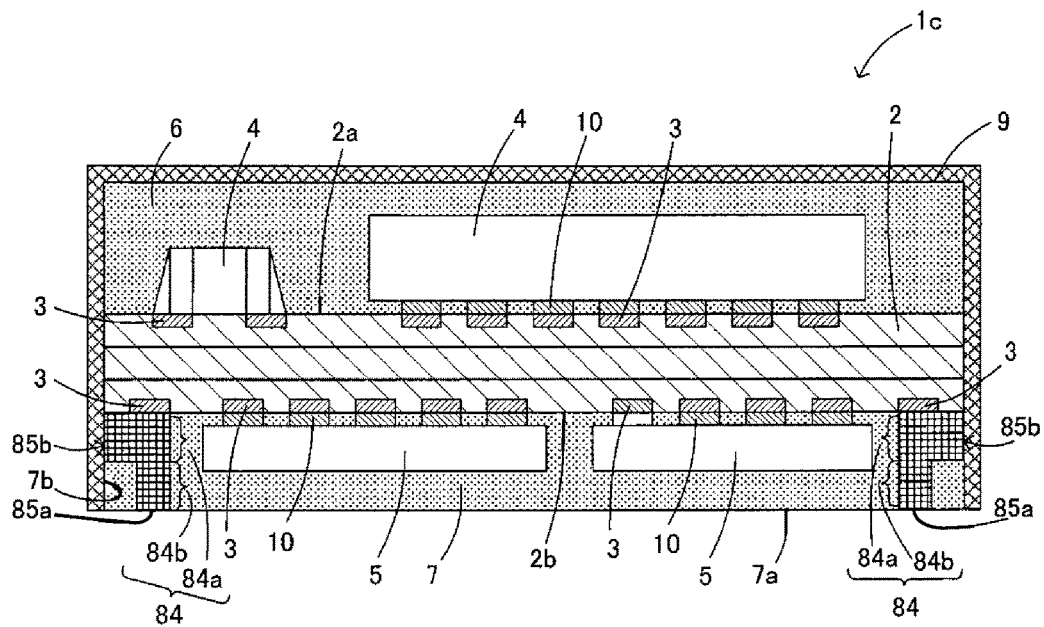
FIGS. 6A and 6B Each of FIGS. 6A and 6B is a sectional view of a high-frequency module according to a third embodiment of the present disclosure.
Figure 6B:
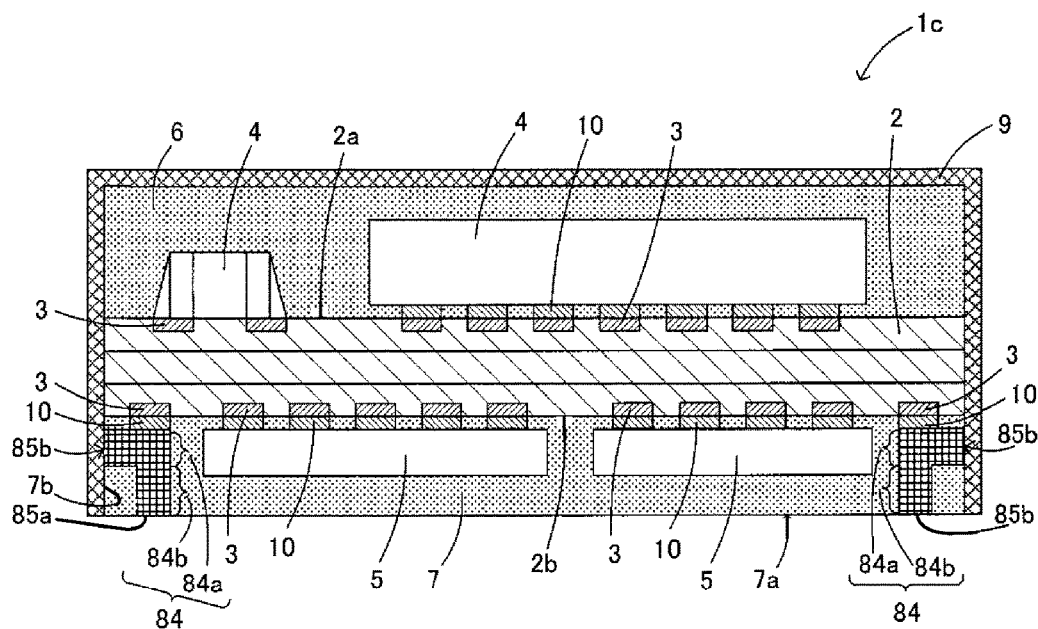
Figure 7:
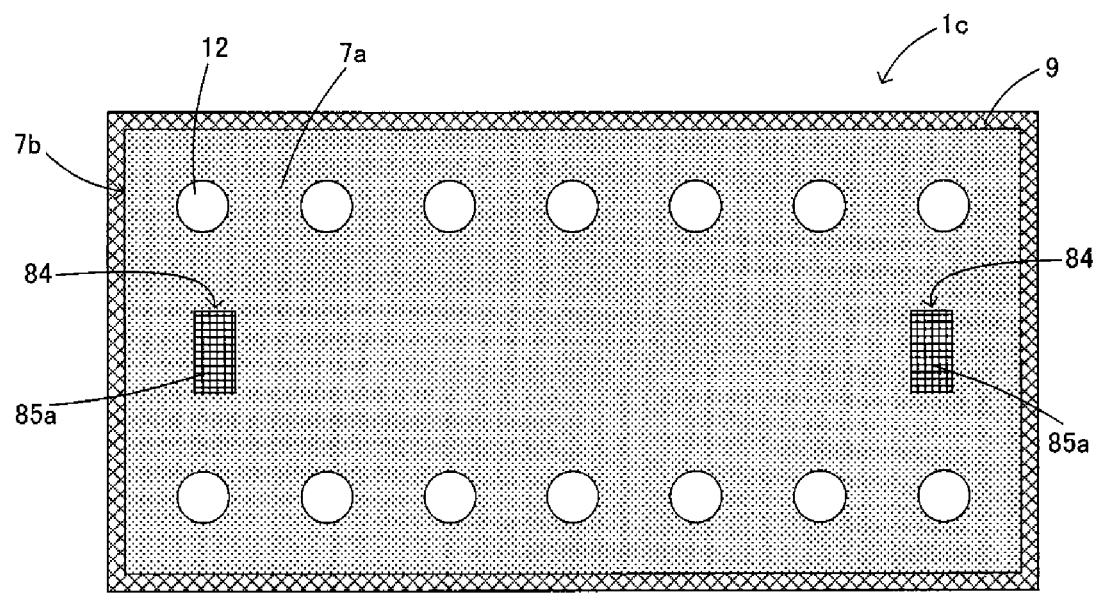
FIG. 7 is a rear view of the high-frequency module according to the third embodiment of the present disclosure.

The high-frequency module 1c according to the third embodiment differs from the high-frequency module 1 according to the first embodiment described with FIG. 1 and FIG. 2 in terms of that, as illustrated in FIGS. 6A and 6B, conductor pins 84 are formed by L-shaped pins. The other configurations are identical to those of the high-frequency module 1 according to the first embodiment, and description thereof is thus omitted by giving identical sign thereto.

As illustrated in FIG. 6A, the conductor pins 84 are each constituted by a first portion 84a connected to the lower surface 2b of the substrate 2 and having a shield connection portion 85b at an end surface, and a second portion 84b having a terminal portion 85a exposed from the lower surface 2b of the lower sealing resin layer 7. As illustrated in FIG. 7, at the lower surface 7a of the lower sealing resin layer 7, the terminal portion 85a is away from the shield layer 9. When the high-frequency module 1c is mounted on the outer substrate, the terminal portion 85a is connected to the ground electrode disposed at the outer substrate. The shield connection portion 85b is connected to the shield layer 9, and the shield layer 9 is thereby connected to the ground potential. As illustrated in FIG. 6B, the solders 10 may be disposed between the conductor pins 84 and the lower surface 2b of the substrate 2.

According to the aforementioned embodiment, the terminal portion 85a and the shield layer 9 are not in contact with each other at the lower surface 2b of the lower sealing resin layer 7, and there is thus no possibility of the shield layer 9 being damaged during the reflow treatment. In addition, there is no possibility of a short circuit occurring between the solders and an electronic component adjacent thereto with the shield layer 9 interposed therebetween.

Fourth Embodiment

A high-frequency module 1d according to a fourth embodiment of the present disclosure will be described with reference to FIGS. 8A, 8B and 8C. Each of FIGS. 8A, 8B and 8C is a sectional view of the high-frequency module 1d according to the fourth embodiment.

Figure 8A:
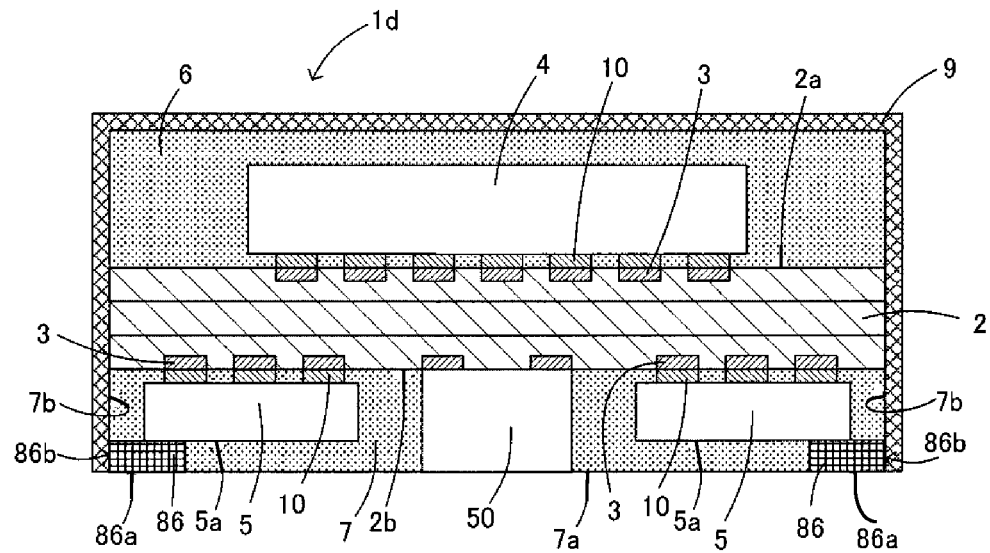
FIGS. 8A, 8B and 8C Each of FIGS. 8A, 8B and 8C is a sectional view of a high-frequency module according to a fourth embodiment of the present disclosure.
Figure 8B:
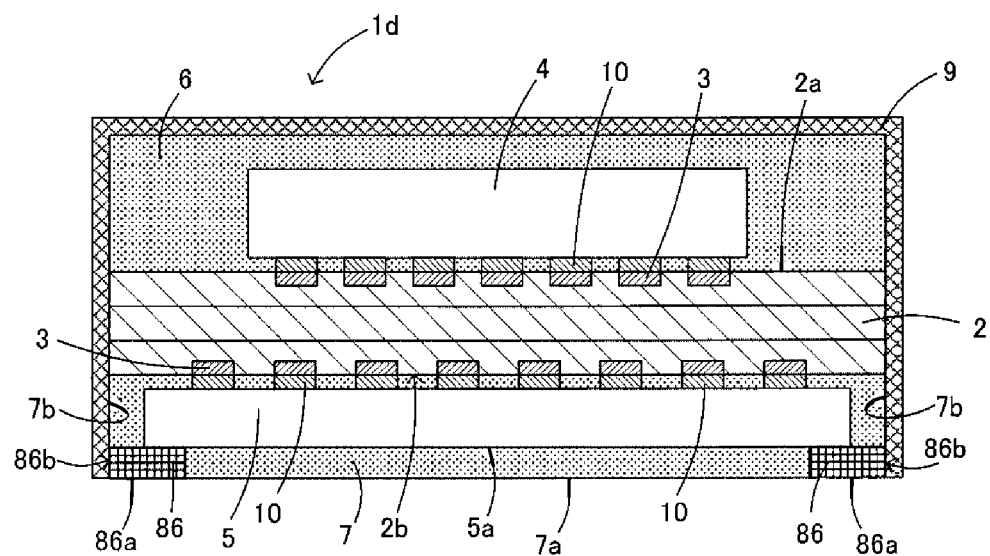
Figure 8C:
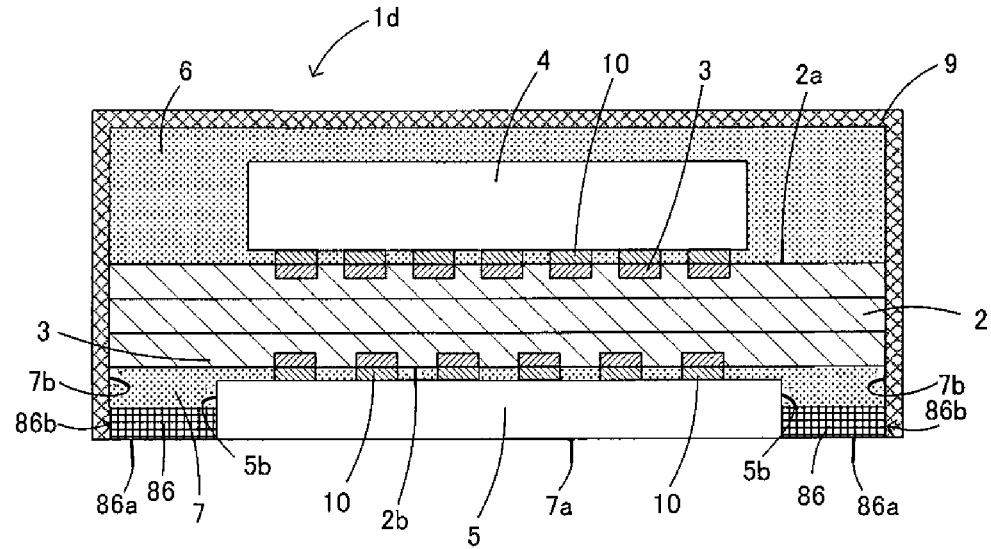

The high-frequency module 1d according to the fourth embodiment differs from the high-frequency module 1 according to the first embodiment described with FIG. 1 and FIG. 2 in terms of that, as illustrated in FIGS. 8A, 8B and 8C, conductor pins 86 are not connected to the lower surface 2b of the substrate 2 and are in contact with the second components 5. The other configurations are identical to those of the high-frequency module 1 according to the first embodiment, and description thereof is thus omitted by giving identical signs thereto.

In the high-frequency module 1d of this embodiment, as illustrated in FIGS. 8A, 8B and 8C, the conductor pins 86 each have a terminal portion 86a, which is a terminal connected to the ground electrode disposed at the outer substrate, and a shield connection portion 86b connected to the shield layer 9, and the conductor pins 86 are not connected to the lower surface 2b of the substrate 2 and are disposed in contact with the second components 5. In other words, the columnar conductor pins 86 are disposed substantially parallel to the lower surface 2b of the substrate 2, and portions of the conductor pins 86 are disposed in contact with the second components 5. For example, as illustrated in FIG. 8A, a plurality of the second components 5 and a component 50 not in contact with the conductor pins 86 may be mounted on the lower surface 2b of the substrate 2, and the conductor pins 86 may be disposed in contact with the corresponding lower surfaces 5a of the second components 5. As illustrated in FIG. 8B, two conductor pins 86 may be disposed in contact with the lower surface 5a of one second component 5. As illustrated in FIG. 8C, the conductor pins 86 may be in contact with a side surface 5b of one second component 5. All of the conductor pins 86 may not be in contact with the second components 5.

According to the aforementioned embodiment, it is possible to obtain the same effect as with the high-frequency module 1 according to the first embodiment and to cause the heat generated from the second components 5 to move outside the high-frequency module 1d by causing the conductor pins 86 to be in contact with the second components 5. As illustrated in FIG. 8C, when the conductor pins 86 are caused to be in contact with the side surface 5b of the second component 5 or when the conductor pins 86 are not in contact with at least the lower surface 5a of the second component 5, it is possible to address low profile of the high-frequency module 1d. Due to the conductor pins 86 not required to be connected to the lower surface 2b of the substrate 2, there is no need to provide the land electrodes 3, and it is thus possible to save the wiring area in the lower surface 2b of the substrate 2 and to improve design flexibility. Moreover, the connectivity with respect to the outer substrate is improved by increasing the area of the conductor pins 86 exposed from the lower surface 7a of the lower sealing resin layer 7. In addition, it is possible to reduce the damage of the shield during the reflow treatment when the connection to the outer substrate is performed.

(Modification of Conductor Pin)

A modification of the conductor pins 86 will be described with reference to FIGS. 9A and 9B. Each of FIGS. 9A and 9B is a sectional view of a high-frequency module 1e.

Figure 9A:
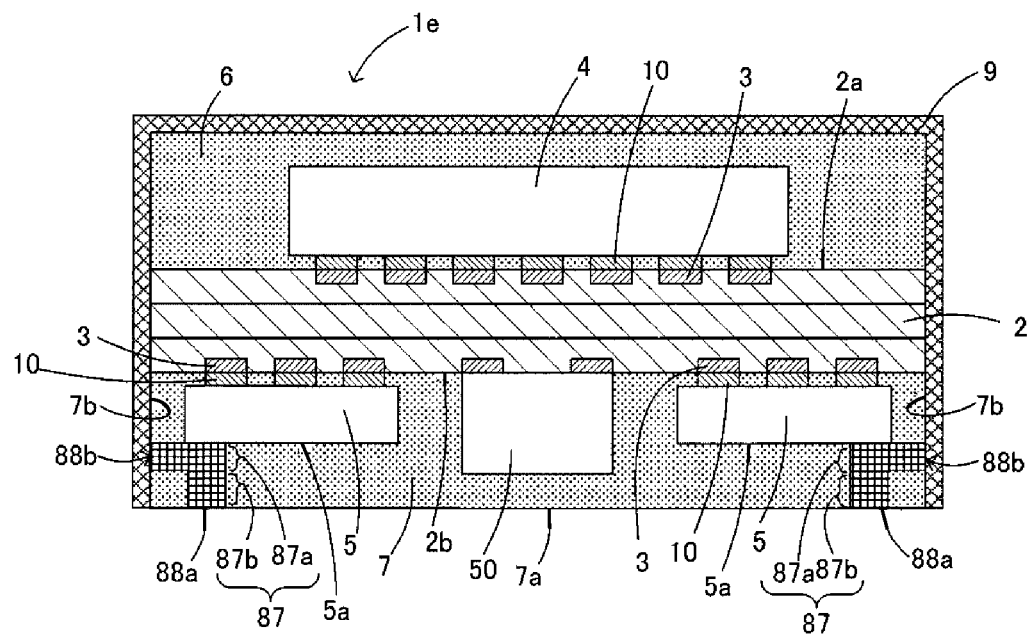
FIGS. 9A and 9 Each of FIGS. 9A and 9B illustrates a modification of the high-frequency module in each of FIGS. 8A, 8B and 8C.
Figure 9B:
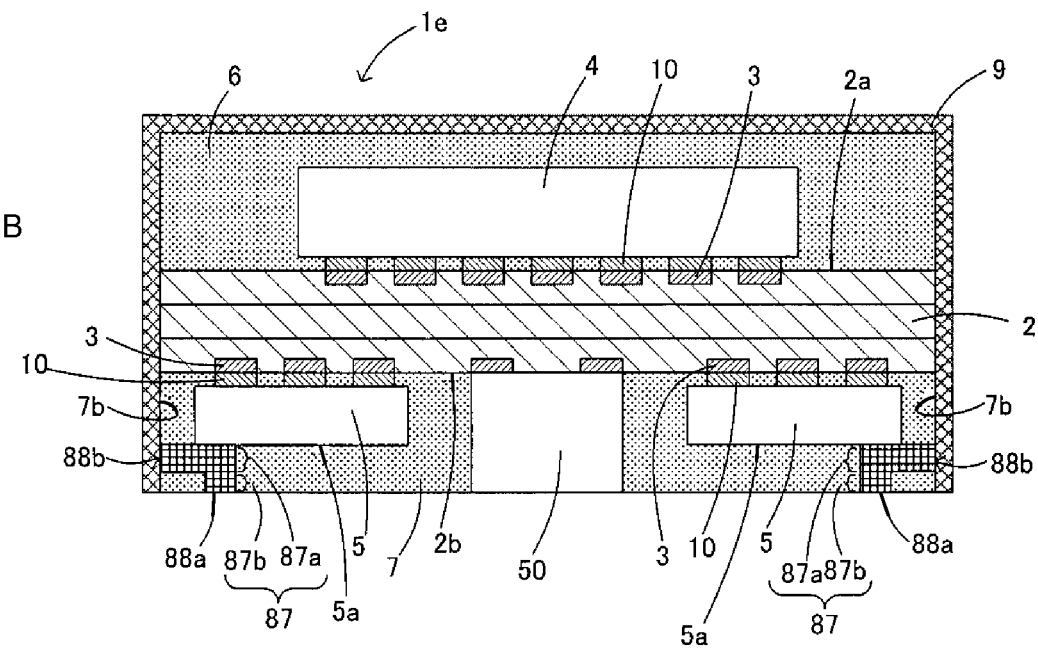
Figure 10:
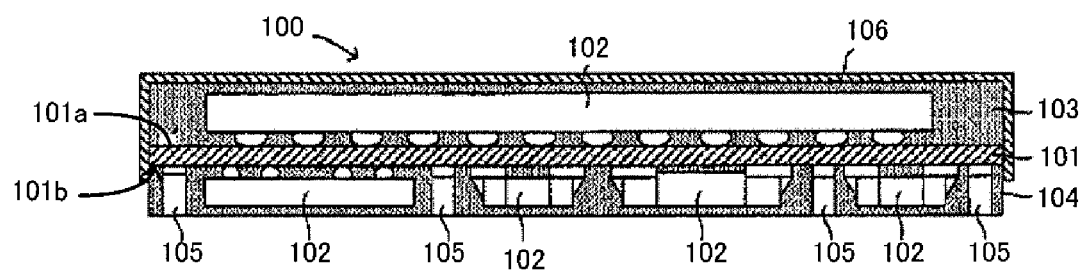
FIG. 10 is a sectional view of an existing high-frequency module.

As illustrated in FIG. 9A, conductor pins 87 are each constituted by a horizontal portion 87a (corresponding to the "first portion" in the present disclosure) connected to the lower surface 5a of the component 5 and having a shield connection portion 88b, and a vertical portion 87b (corresponding to the "second portion" in the present disclosure) having a terminal portion 88a exposed from the lower surface 7a of the lower sealing resin layer 7. In this case, the conductor pins 87 are not required to be connected to the lower surface 2b of the substrate 2, and the land electrodes 3 are thus not required to be disposed on the lower surface 2b of the substrate 2, which achieves a reduction in the wiring area and an improvement in design flexibility. The lower surface 7a of the lower sealing resin layer 7 may be ground or abraded so that, as illustrated in FIG. 9B, the component 50 is exposed from the lower surface 7a of the lower sealing resin layer 7. In this case, it is possible to cause the heat generated from the component 50 to move outside the high-frequency module 1e.

Note that the present disclosure is not limited to the aforementioned embodiments and can be variously modified, in addition to the aforementioned modifications, within the spirit of the present disclosure.

The present disclosure is applicable to a module that includes a substrate on which a heat-generating component is mounted and that has a heat-dissipation structure.

1, 1a to 1e module
2 substrate
2a upper surface (first major surface)
2b lower surface (second major surface)
4 first component
5 second component
6 upper sealing resin layer (first sealing resin layer)
7 lower sealing resin layer (second sealing resin layer)
8, 80, 81, 84, 86, 87 conductor pin (connection conductor)
81a horizontal portion (third portion)
81b vertical portion (fourth portion)
83 conductor pin joined body
87a horizontal portion (first portion)
87b vertical portion (second portion)
9 shield layer

The invention claimed is:

1. A high-frequency module comprising:
a substrate;
a first component mounted on a first major surface of the substrate;
a first sealing resin layer sealing the first major surface and the first component;
a second sealing resin layer laminated on a second major surface of the substrate and having an abutting surface abutting on the second major surface of the substrate, an opposite surface opposing to the abutting surface, and a side surface connecting edges of the abutting surface and the opposite surface to each other;
a connection conductor disposed at the second sealing resin layer; and
a shield layer covering at least a surface of the first sealing resin layer, the side surface of the second sealing resin layer, and a side surface of the substrate connecting edges of the first major surface and the second major surface to each other,
wherein the connection conductor includes a portion exposed from the side surface of the second sealing resin layer and connected to the shield layer, and a portion exposed from the opposite surface of the second sealing resin layer and connected to a ground electrode of an outer substrate,
wherein the connection conductor is connected to the shield layer only at the portion exposed from the side surface of the second sealing resin layer, and
wherein the portion exposed from the side surface of the second sealing resin layer is in contact with the second major surface of the substrate and is continuous with the portion exposed from the opposite surface of the second sealing resin layer.

2. The high-frequency module according to claim 1,
wherein the connection conductor includes a pair of leg portions erected at the second major surface with first ends of the pair of leg portions connected to the second major surface of the substrate, and a bridging portion connecting second ends of the pair of leg portions to each other,
wherein, in the connection conductor,
the bridging portion includes a portion exposed from the side surface of the second sealing resin layer, and a portion exposed from the opposite surface, and
each of the leg portions includes a portion exposed from the side surface of the second sealing resin layer.

3. The high-frequency module according to claim 1,
wherein the connection conductor includes
a first portion extending in a direction parallel to the second major surface of the substrate with a first end of the first portion exposed from the side surface of the second sealing resin layer, and
a second portion extending from a second end of the first portion toward the opposite surface of the second sealing resin layer and having an end portion exposed from the opposite surface.

4. The high-frequency module according to claim 1,
wherein the connection conductor includes
a third portion extending in a direction parallel to the opposite surface of the second sealing resin layer, and
a fourth portion extending from a first end of the third portion toward the second major surface of the substrate, and
wherein the third portion includes a portion exposed from the side surface of the second sealing resin layer, and a portion exposed from the opposite surface of the second sealing resin layer.

5. A method of manufacturing the high-frequency module according to claim 4, the method comprising:
a substrate aggregate preparation step of preparing a substrate aggregate including a plurality of substrates arrayed in a matrix form;
a mounting step of mounting the first component on the first major surface of each of the plurality of substrates and, on a side of the second major surface of each of the plurality of substrates, mounting a conductor pin joined body so as to span the substrates adjacent to each other, the conductor pin joined body including two conductor pins each including the third portion, respective second ends of the third portion of the two conductor pins being connected to each other;

a sealing-resin-layer formation step of forming the first sealing resin layer sealing the first component mounted on each of the plurality of substrates and the first major surface of each of the plurality of substrates and forming the second sealing resin layer sealing the conductor pin joined body mounted on each of the plurality of substrates and the second major surface of each of the plurality of substrates;

an exposing step of grinding or abrading the opposite surface of the second sealing resin layer, thereby exposing a portion of the conductor pin joined body from the opposite surface of the second sealing resin layer; and a dividing step of dividing the substrate aggregate into the substrates divided from each other, wherein, in the mounting step, one of the fourth portions in the conductor pin joined body is connected to one of the substrates adjacent to each other, another one of the fourth portions is connected to another one of the substrates adjacent to each other, and the conductor pin joined body is thereby mounted so as to span the substrates adjacent to each other, and wherein, in the dividing step, the first sealing resin layer, the second sealing resin layer, and the substrate aggregate are cut together with, of the conductor pin joined body, a connection portion between the two conductor pins to form connection conductors, and a portion of the third portion in each of the connection conductors is exposed from the side surface of the second sealing resin layer.

6. The high-frequency module according to claim 1, wherein the connection conductor is not connected to the substrate.

7. The high-frequency module according to claim 6, further comprising:

a second component mounted on the second major surface of the substrate, wherein the connection conductor is in contact with the second component.

* * * * *